(12) United States Patent
Kuwabara

(10) Patent No.: US 6,472,249 B1
(45) Date of Patent: Oct. 29, 2002

(54) SEMICONDUCTOR DEVICE HAVING SEALING FILM FORMED ON THE SURFACE HAVING COLUMNAR ELECTRODE FORMED THEREON AND METHOD OF MANUFACTURING THE SAME

(75) Inventor: Osamu Kuwabara, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 93 days.

(21) Appl. No.: 09/630,677

(22) Filed: Aug. 1, 2000

(30) Foreign Application Priority Data

Sep. 14, 1999 (JP) .......................................... 11-260614

(51) Int. Cl.⁷ ............................................. H01L 21/44
(52) U.S. Cl. ....................................... 438/106; 438/112
(58) Field of Search ................................. 438/106, 112, 438/114

(56) References Cited

U.S. PATENT DOCUMENTS

| | | | |
|---|---|---|---|
| 4,417,630 A | * 11/1983 | Weber et al. | ................... 177/1 |
| 5,232,651 A | 8/1993 | Okuno et al. | |
| 5,650,667 A | 7/1997 | Liou | |
| 5,658,827 A | * 8/1997 | Aulicino et al. | ....... 228/180.22 |
| 5,908,317 A | 6/1999 | Heo | |
| 6,319,851 B1 | * 11/2001 | Mihara et al. | ............... 438/778 |

FOREIGN PATENT DOCUMENTS

| | | |
|---|---|---|
| EP | 0 993 040 A | 4/2000 |
| EP | 1 085 564 A | 3/2001 |
| JP | 3-293740 | 12/1991 |
| JP | 4-346235 | 12/1992 |
| JP | 5-129373 | 5/1993 |
| JP | 7-183425 | 12/1993 |
| JP | 2000-208535 A | 1/1999 |

* cited by examiner

*Primary Examiner*—Michael Sherry
*Assistant Examiner*—Scott B. Geyer
(74) *Attorney, Agent, or Firm*—Frishauf, Holtz, Goodman & Chick, P.C.

(57) ABSTRACT

A sealing film is formed by a screen printing method. In this case, the temperature of the printing table is set at about 30 to 50° C. by the heat generation from a planar heater arranged within the printing table. A liquid sealing resin having a relatively high viscosity of about 500,000 to 1,500,000 cPS is used for forming the sealing film. However, the liquid sealing film is warmed by the printing table to about 30 to 50° C. As a result, the viscosity of the liquid sealing resin is lowered to about 50,000 to 200,000 cPS. After the curing, the viscosity of the sealing film is brought back to the original value of about 500,000 to 1,500,000 cPS.

31 Claims, 17 Drawing Sheets

SEMICONDUCTOR DEVICE HAVING SEALING FILM FORMED ON THE SURFACE HAVING COLUMNAR ELECTRODE FORMED THEREON AND METHOD OF MANUFACTURING THE SAME

CROSS-REFERENCE TO RELATED APPLICATIONS

This application is based upon and claims the benefit of priority from the prior Japanese Patent Application No. 11-260614, filed Sep. 14, 1999, the entire contents of which are incorporated herein by reference.

BACKGROUND OF THE INVENTION

The present invention relates to a semiconductor device having a sealing film formed on the surface having columnar electrodes, which are connected to electrode pads of the semiconductor device, formed thereon and a method of manufacturing the same.

A method of forming columnar electrodes connected to electrode pads formed in a semiconductor device and Bonding the semiconductor device to a circuit board via the columnar electrodes is known to the art as a face down bonding method. The face down bonding method is advantageous in that a semiconductor device can be bonded in its size, making it possible to miniaturize the apparatus, compared with QFP (Quad Flat Package). In the face down bonding method, however, the step of pouring a liquid sealing resin into the clearance between the semiconductor device and the circuit board after the bonding step takes time, leading to low productivity. To overcome this difficulty, a method of forming a sealing film on the surface having columnar electrodes of a semiconductor device formed thereon is now under study. FIGS. 15 to 17 collectively exemplify the particular conventional method.

In the first step, a semiconductor substrate 1 such as a wafer state silicon substrate having a plurality of columnar electrodes 2 formed thereon is prepared, followed by forming by a molding method or a spin coating method a sealing film 3 on the upper surface of the semiconductor substrate 1 having the columnar electrodes 2 formed thereon, as shown in FIG. 15. Therefore, the upper surfaces of the columnar electrodes 2 are covered with the sealing film 3 in this state. Then, the upper surface of the sealing film 3 is polished or etched appropriately so as to expose the upper surfaces of the columnar electrodes 2, as shown in FIG. 16. Further, solder balls 4 are formed on the upper surfaces of the columnar electrodes 2, as shown in FIG. 17. Finally, a dicing treatment is applied to separate the wafer to individual semiconductor devices.

Where the sealing film 3 is formed by a molding method, complex process steps and costly apparatuses are required. Further, the molding method gives rise to an additional problem that the semiconductor substrate 1 tends to be deformed by the heating so as to bring about a large unevenness in the height of the columnar electrodes 2. On the other hand, where the sealing film 3 is formed by a spin coating method, it is necessary to use a liquid sealing resin having a relatively low viscosity, with the result that a large difference in the linear expansion coefficient is brought about between the sealing film 3 and the semiconductor substrate 1. As a result, when stress derived from the difference in the linear expansion coefficient is generated between the sealing film 3 and the semiconductor substrate 1, cracks are generated between the columnar electrodes 2 and the solder balls 4.

BRIEF SUMMARY OF THE INVENTION

An object of the present invention is to provide a method of manufacturing a semiconductor device, which permits using a relatively cheap apparatus and also permits using a liquid sealing resin having a relatively high viscosity.

According to a first aspect of the present invention, there is provided a method of manufacturing a semiconductor device, comprising the steps of:

preparing a semiconductor substrate having a plurality of columnar electrodes formed apart from each other on one main surface;

loading a warmed liquid sealing resin between adjacent columnar electrodes on at least one main surface of the semiconductor substrate; and cooling the liquid sealing resin so as to solidify the sealing resin to. form a sealing film on the one main surface of the semiconductor substrate.

According to a second aspect of the present invention, there is provided a method of manufacturing a semiconductor device, comprising the steps of:

preparing a semiconductor substrate having a plurality of columnar electrodes formed apart from each other on one main surface;

arranging a printing mask on the semiconductor substrate;

heating the semiconductor substrate and the printing mask to a predetermined temperature;

supplying a liquid sealing resin onto the printing mask so as to have the liquid sealing resin warmed by the printing mask; and loading the warmed liquid sealing resin into the clearance between adjacent columnar electrodes formed on one main surface of the semiconductor substrate so as to form a sealing film.

According to a third aspect of the present invention, there is provided a method of manufacturing a semiconductor device, comprising the steps of:

preparing a semiconductor substrate having a plurality of columnar electrodes formed apart from each other on one main surface;

arranging a mask on one main surface of the semiconductor substrate;

printing a liquid sealing resin on the one main surface of the semiconductor substrate from above the mask by using a squeegee so as to form a sealing film loaded in the clearance between adjacent columnar electrodes; and measuring the weight of the semiconductor substrate having the sealing film formed thereon so as to judge whether or not the thickness of the sealing film is appropriate.

Further, according to a fourth aspect of the present invention, there is provided a semiconductor device, comprising:

a semiconductor substrate having a plurality of columnar electrodes formed thereon apart from each other; and a sealing film formed on one main surface of the semiconductor substrate so as to be loaded in the clearance between adjacent columnar electrodes;

wherein the upper surface of the sealing film is substantially flush with the upper surface of the columnar electrode in the vicinity of the columnar electrode and is most recessed in substantially the central portion between adjacent columnar electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF INVENTION

Some embodiments of the present invention will now be described with reference to the accompanying drawings.

[First Embodiment]

Figure 1:
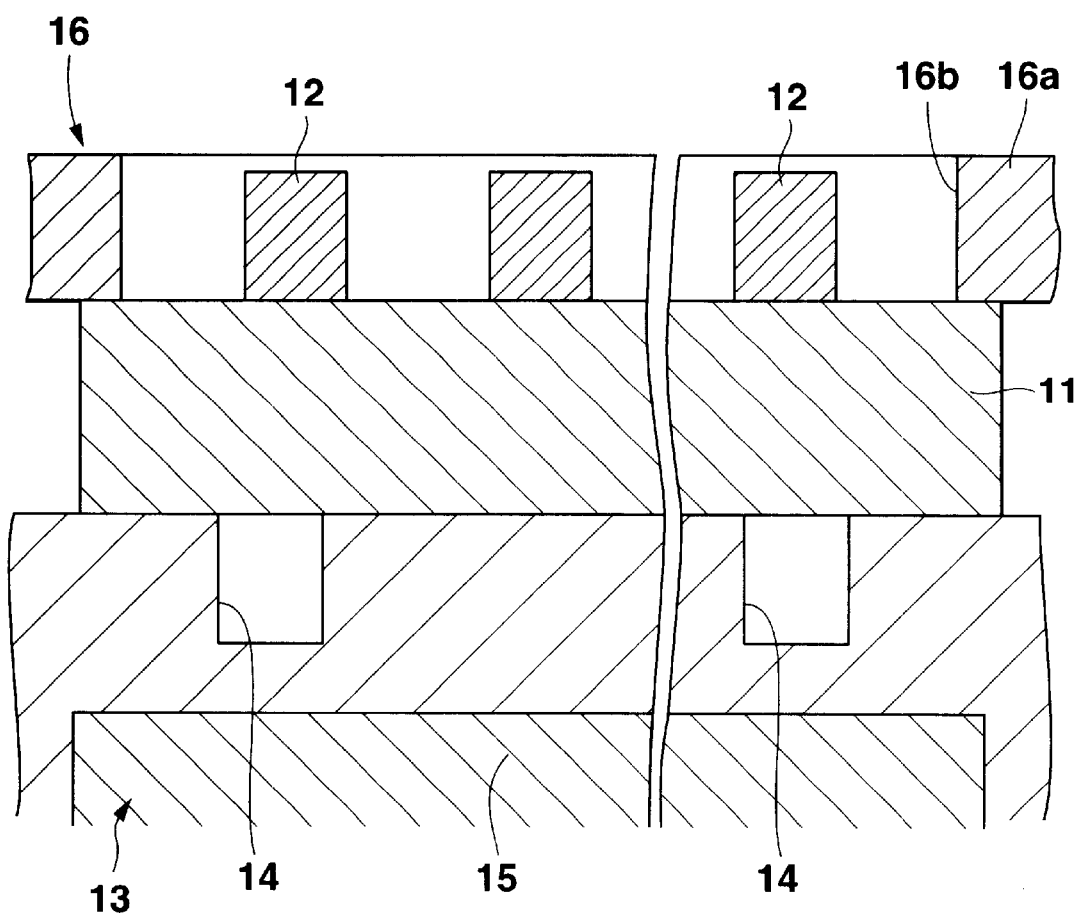
FIG. 1 is a cross sectional view showing in a magnified fashion the first step of a method of manufacturing a semiconductor device according to one embodiment of the present invention.
Figure 8:
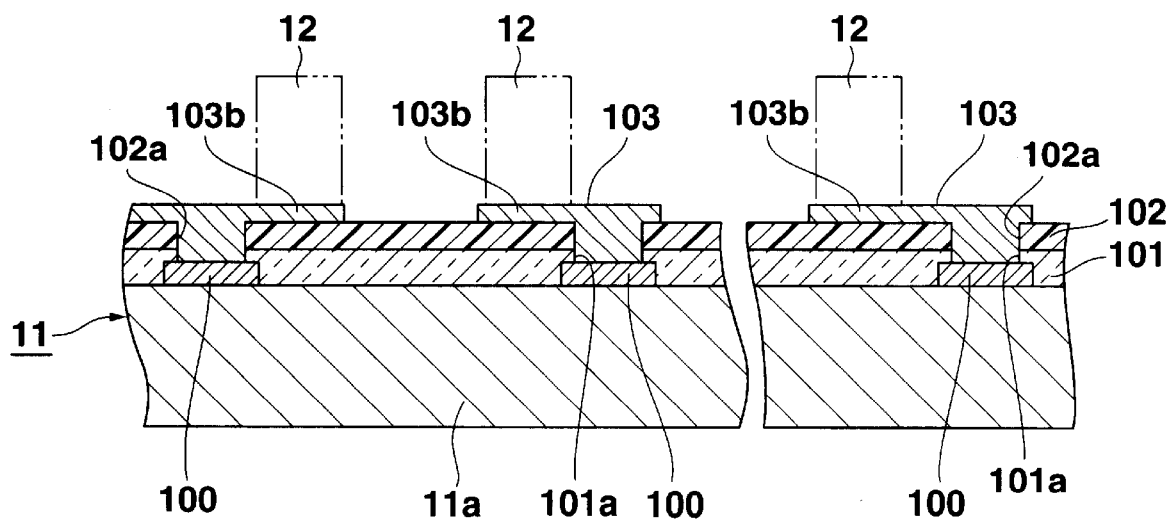
FIG. 8 is a cross sectional view showing in detail in a magnified fashion a semiconductor substrate used in the present invention.

FIGS. 1 to 4 collectively show the steps of manufacturing a semiconductor device according to a first embodiment of the present invention. The method of manufacturing a semiconductor device according to the first embodiment of the present invention will now be described with reference to FIGS. 1 to 4 in the order mentioned. In the first step, prepared is a semiconductor substrate 11 having a large number of columnar electrodes 12 formed a predetermined distance apart from each other on one main surface thereof, as shown in FIG. 1. The semiconductor substrate 11 consists of, for example, a silicon wafer having a diameter of 100 mm to 300 mm. To be more specific, a large number of electrode pads 100 are formed inside the scribe lines (not shown) on one main surface of a substrate 11a, as shown in FIG. 8. A passivation film 101 covering the peripheral portion of each of the electrode pads 100 is formed on the surface of the substrate 11a. The passivation film 101 is made of an insulating film such as a silicon oxide film and includes openings 101a exposing the central portion of each of the electrode pads 100. A protective film 102 made of, for example, polyimide is formed on the upper surface of the passivation film 101. The protective film 102 includes openings 102a substantially equal in size to the openings 101a of the passivation film 101. Conductive layers 103 each having one end portion connected to the electrode pad 100 are formed within the openings 101a of the passivation film 101 and the opening 102a of the protective film 102. Each conductive layer 103 has the other end portion 103b extending over the protective film 102. The semiconductor substrate 11 shown in FIGS. 1 to 4 is constructed as described above, though the detailed construction of the semiconductor substrate 11 is not shown in FIGS. 1 to 4.

As shown in FIG. 1, a large number of columnar electrodes 12 each having a height of 100 to 300 $\mu$m are formed on one main surface of the semiconductor substrate 11. Each columnar electrode 12 formed on the other end portion 103b of the conductive layer 103 of the semiconductor substrate 11 shown in FIG. 8 is formed in substantially the same planar shape (not shown) as the other end portion 103b noted above.

A suction groove 14 is formed on an upper surface of a printing table 13 within a region in which the semiconductor substrate is disposed, and the space within the suction groove 14 is made to bear a negative pressure by the driving of a vacuum pump (not shown). As a result, the semiconductor substrate 11 is sucked on the upper surface of the printing table 13. A planar heater 15 is arranged within the printing table 13 in a manner to be positioned below the suction groove 14. The printing table 13 can be heated to about 30 to 50° C. by the heat generated from the heater 15. Also, the temperature of the semiconductor substrate 11 sucked on the printing table 13 is maintained at about 30 to 50° C. by the heat of the printing table 13.

Figure 9:
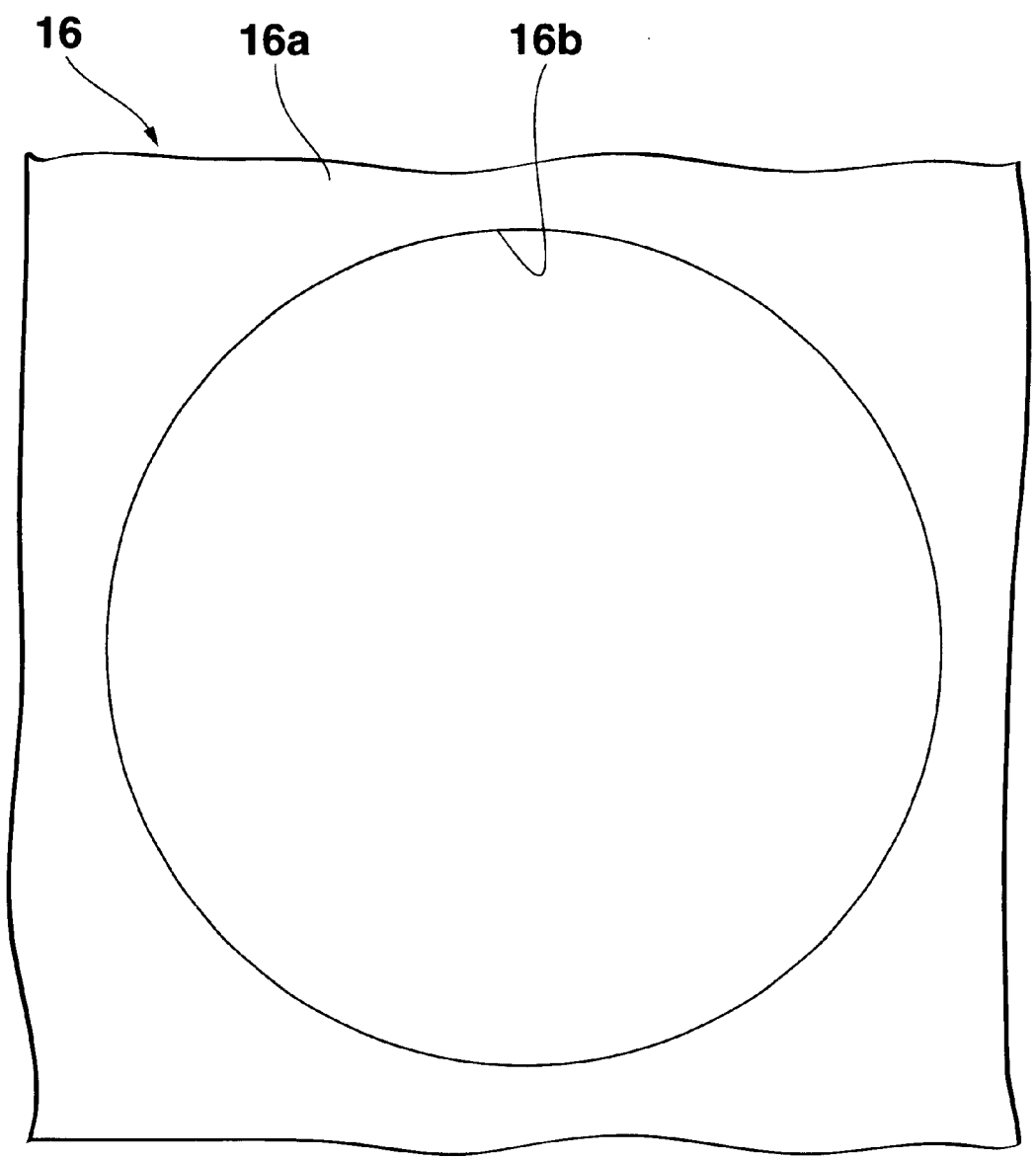
FIG. 9 is a plan view showing a printing mask used in the first embodiment and the second embodiment of the present invention.

The semiconductor substrate 11 is disposed in a predetermined position on the upper surface of the printing table 13 such that the main surface having the columnar electrodes 12 formed thereon faces upward. Then, a printing mask 16 is disposed in a predetermined position on the one main surface of the semiconductor substrate 11, i.e., on the protective film 102 and the conductive film 103. The printing mask 16 includes a mask body 16a formed thicker than the height of the columnar electrode 12. As shown in FIG. 9, a circular opening 16b somewhat smaller than the planar size of the semiconductor substrate 11 is formed in the printing mask 16. The printing mask 16 is disposed on the semiconductor substrate 11 such that the peripheral portion of the opening 16b of the mask body 16a conforms with the peripheral portion of the semi-conductor substrate 11. It follows that the peripheral portion of the printing mask 16 extends over the peripheral portion of the semiconductor substrate 11. The extending portion floats from the printing table 13 so as not to be supported by any member. The printing mask 16 is also heated to about 30 to 50° C. through the semiconductor substrate 11 heated by the printing table 13.

Figure 2:
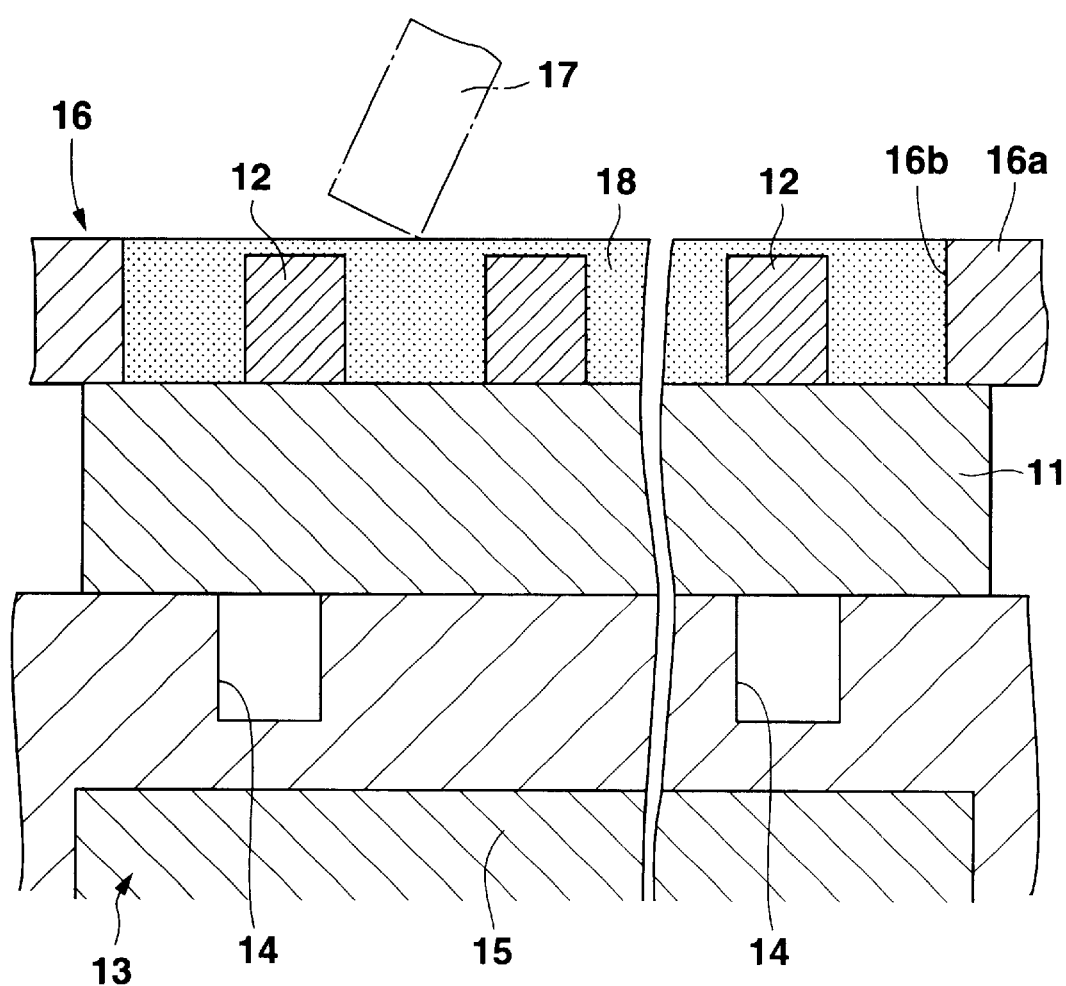
FIG. 2 is a cross sectional view showing in a magnified fashion the manufacturing step following the first step shown in FIG. 1.

In the next step, a liquid sealing resin is printed within the opening 16b of the printing mask 16 by using a squeegee 17 having a strip-like side view so as to form a sealing film 18, as shown in FIG. 2. In this state, the upper surface of the columnar electrode 12 is covered with the sealing film 18. The liquid sealing resin is prepared by mixing 50 to 80% by weight of silica particles, which serve to lower the thermal expansion coefficient, with an epoxy resin. Before supply onto the printing mask 16, the liquid sealing resin has a very high viscosity, i.e., about 500,000 to 1,500,000 cPS.

Since the heater 15 arranged within the printing table 13 is heated to 30 to 50° C., the liquid sealing resin is heated to the temperature substantially equal to that of the printing table 13 soon after the resin is supplied onto the printing mask 16. By this heating, the viscosity of the liquid sealing resin is lowered to about 50,000 to 200,000 cPS. As a result, the rolling properties of the liquid sealing resin are improved such that the resin can be printed to have a flat surface without involving air therein. Also, since the viscosity of the liquid sealing resin is lowered, it is possible to improve the moving speed of the squeegee 17 to about 10 to 15 mm/sec so as to improve the productivity. The viscosity of the sealing film 18 is brought back to the original level of about 500,000 to 1,500,000 cPS after completion of the printing and the subsequent cooling for curing. The printed sealing resin can be cooled forcedly or naturally by allowing the printed sealing resin to stand under the flow of the cooled air atmosphere.

Figure 3:
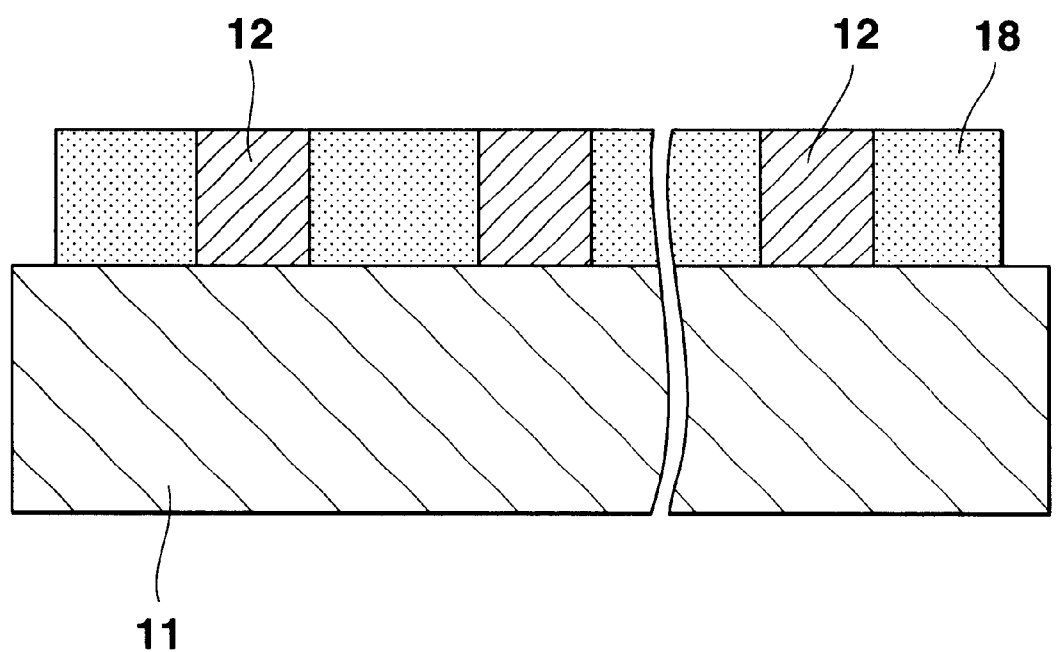
FIG. 3 is a cross sectional view showing in a magnified fashion the manufacturing step following the step shown in FIG. 2.
Figure 4:
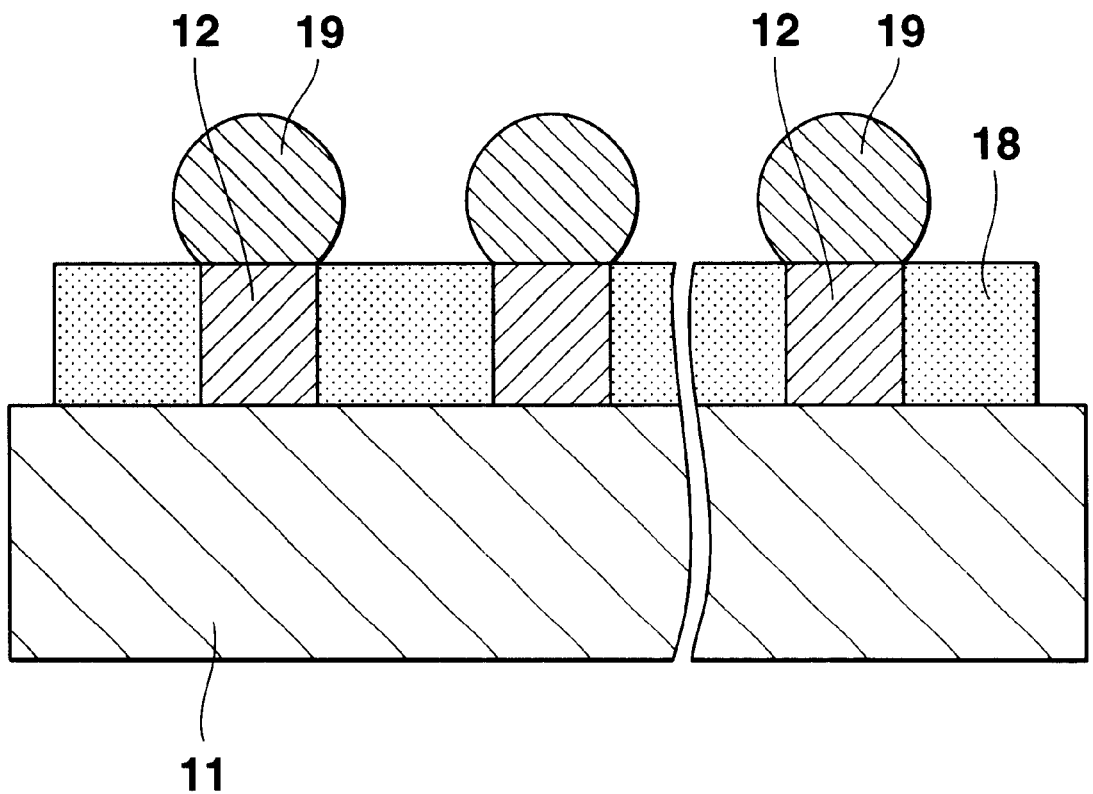
FIG. 4 is a cross sectional view showing in a magnified fashion the manufacturing step following the step shown in FIG. 3.

In the next step, the upper surface of the sealing film 18 is polished or etched appropriately to expose the upper surface of the columnar electrode 12, as shown in FIG. 3. Then, a solder ball 19 is formed on the upper surface of the columnar electrode 12, as shown in FIG. 4, followed by dicing the semiconductor substrate 11 so as to obtain individual semiconductor devices.

In the semiconductor device thus obtained, it is possible to allow the sealing film 18 after the curing to have a relatively high viscosity, i.e., the original level of 500,000 to 1,500,000 cPS, in spite of the fact that the viscosity of the liquid sealing resin during the screen printing process is relatively low, i.e., about 50,000 to 200,000 cPS. As a result, the difference in the linear expansion coefficient between the sealing film 18 and the silicon substrate 11 is diminished. It follows that, even if stress derived from the difference in the linear expansion coefficient is generated between the sealing film 18 and the silicon substrate 11, cracks are unlikely to be generated at the interface between the columnar electrode 12 and the solder ball 19.

[Second Embodiment]

Figure 5:
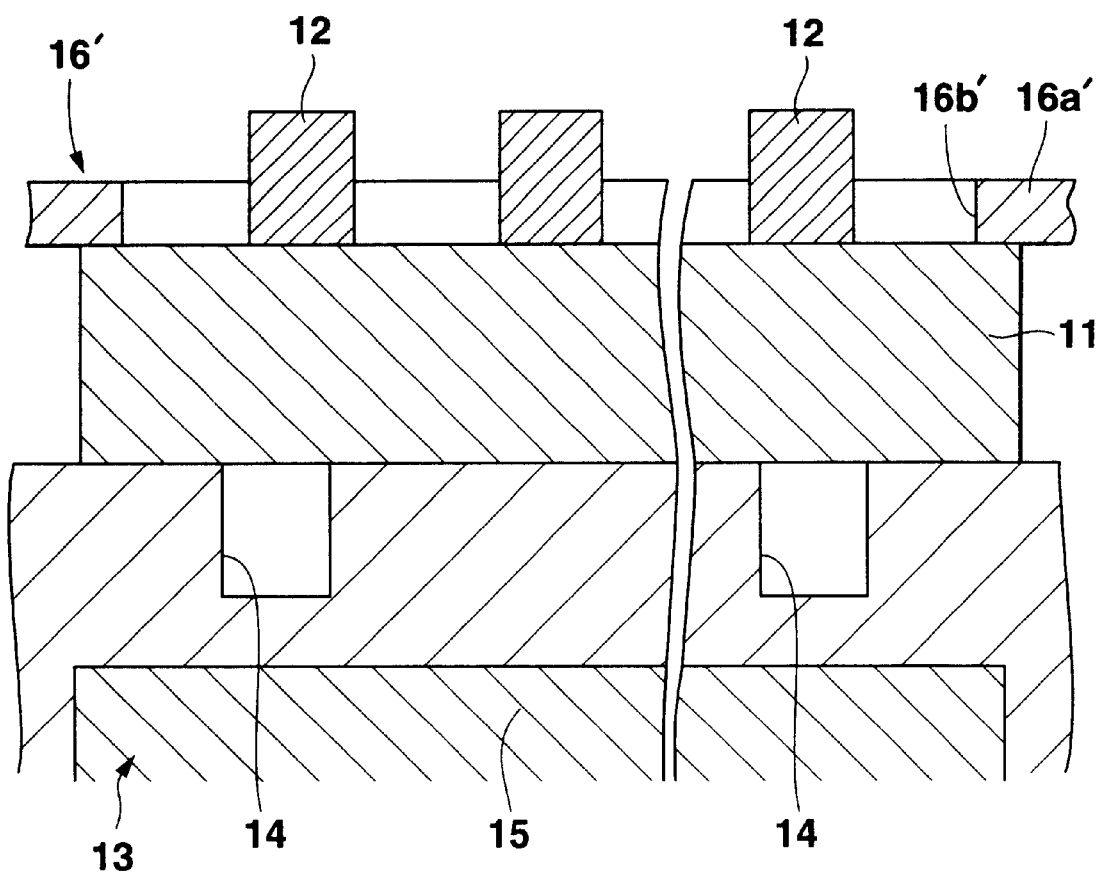
FIG. 5 is a cross sectional view showing in a magnified fashion the first step of a method of manufacturing a semiconductor device according to a second embodiment of the present invention.
Figure 6:
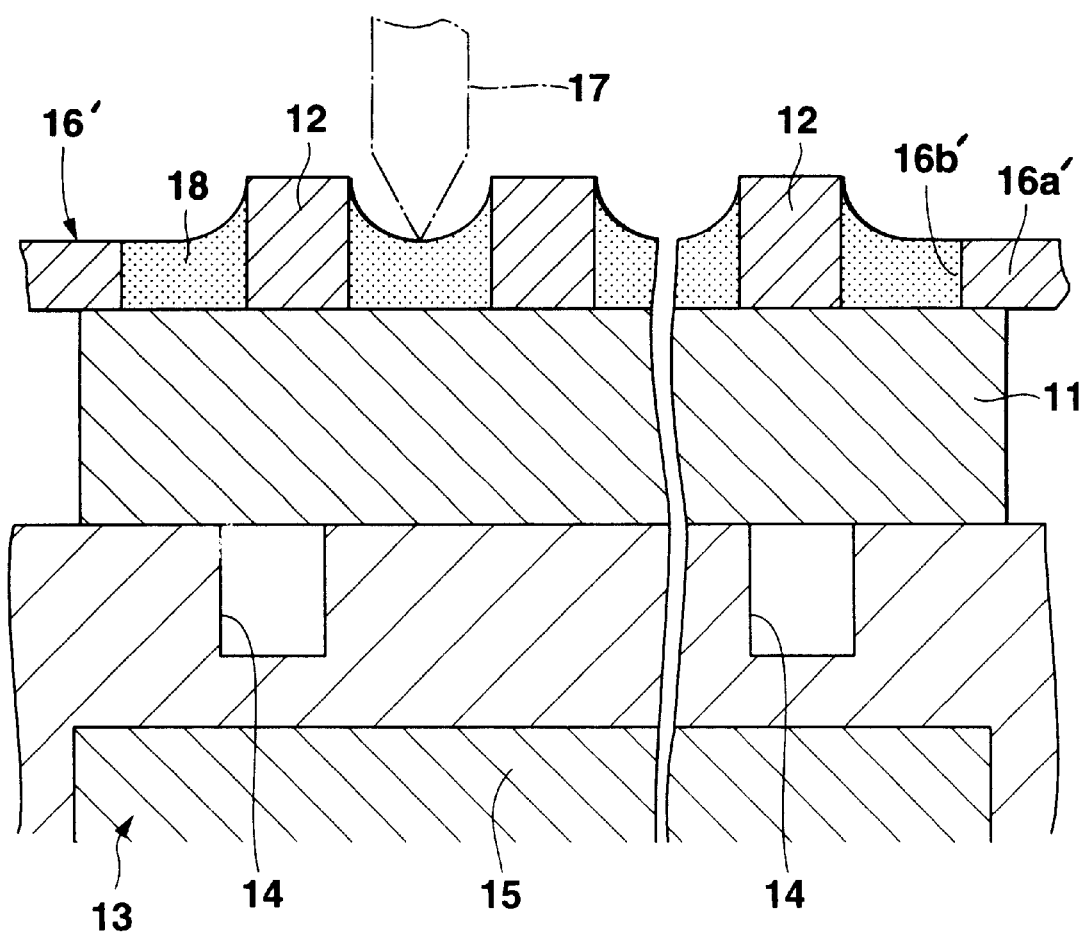
FIG. 6 is a cross sectional view showing in a magnified fashion the manufacturing step following the step shown in FIG. 5.
Figure 7:
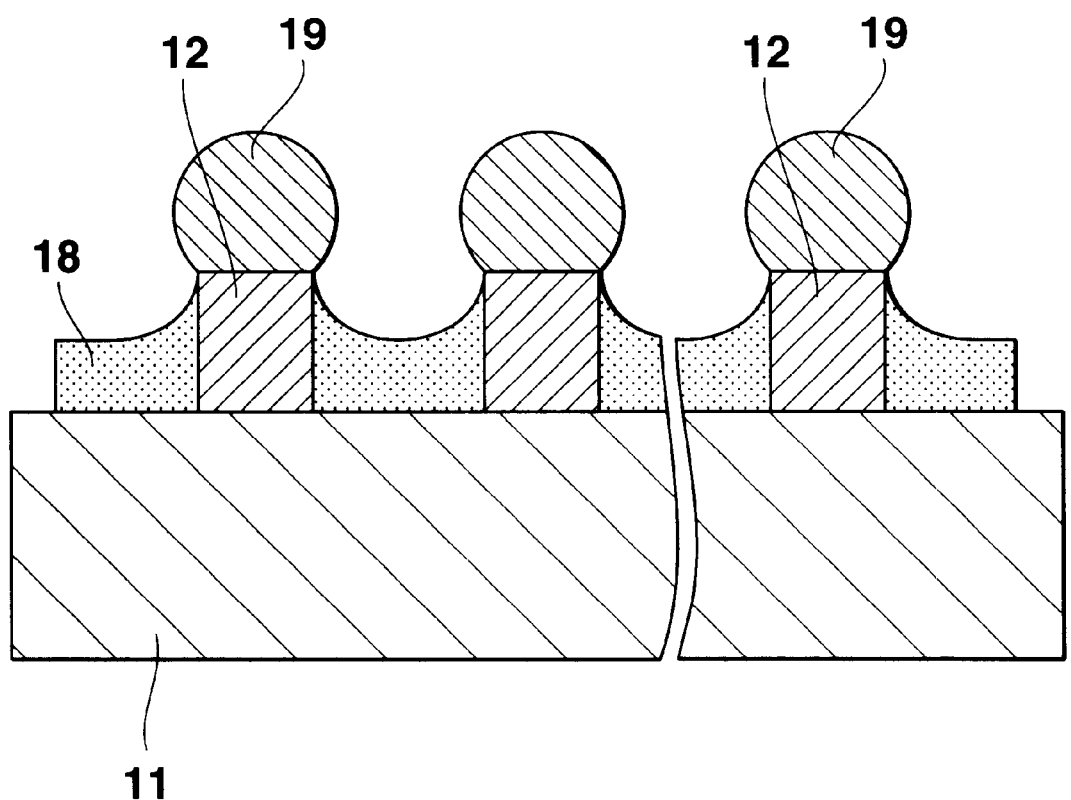
FIG. 7 is a cross sectional view showing in a magnified fashion the manufacturing step following the step shown in FIG. 6.

FIGS. 5 to 7 collectively show the manufacturing steps of a semiconductor device according to a second embodiment of the present invention. The method of manufacturing the semiconductor device according to the second embodiment of the present invention will now be described with reference to FIGS. 5 to 7 in the order mentioned. In this case, however, the description is omitted in respect of the heat generation from the heater 15 for lowering the viscosity of the liquid sealing resin while the printing table 13 with the heater 15 is arranged just the same as shown in FIG. 1.

In the first step, the semiconductor substrate 11 of a wafer state, on which a plurality of columnar electrodes 12 are formed, is disposed in a predetermined region on the upper surface of the printing table 13, as shown in FIG. 5. The semiconductor substrate 11 thus disposed is sucked on the printing table 13. Then, the printing mask 16' is disposed in a predetermined region on the upper surface of the semiconductor substrate 11. The printing mask 16' differs from the printing mask 16 described previously in conjunction with the first embodiment. Specifically, the printing mask 16' used in the second embodiment has a thickness smaller than the height of the columnar electrode 12 and has a planar shape such that a circular opening 16b', which is somewhat smaller than the planar size of the semiconductor substrate 11, is formed in the mask body 16a'.

In the next step, a liquid resin is printed within the opening 16b of the printing mask 16' by using a squeegee 17 having a tip portion that is substantially V-shaped in its side view so as to form the sealing resin 18. In this case, it is desirable for the squeegee 17 to be made of urethane based rubber with the angle at the tip portion of the squeegee 17 to fall within a range of between 55° and 80°, typically, about 60°. Further, the hardness of the squeegee 17 should be 55° to 80° in the JIS (Japanese Industrial Standards) specification. In the printing step, the squeegee 17 is reciprocated in substantially a vertical state such that the tip portion of the squeegee 17 is pushed into the clearance between adjacent columnar electrodes 12 to form the sealing film 18 such that the thickness of the sealing film 18 is smaller than the height of the columnar electrode 12, and the sealing film 18 is recessed between adjacent columnar electrodes 12 as shown in FIG. 6. Although not shown in FIG. 6, the sealing film 8 between the adjacent columnar electrodes 12 arranged in the vertical direction to the surface of the drawing is also recessed just the same as shown in FIG. 6, since the tip portion of the squeegee 17 is made of a deformable material. Incidentally, where the sealing film 18 is formed on the upper surface of the columnar electrode 12, the sealing film 18 on and in the vicinity of the columnar electrode 12 is polished or etched appropriately so as to expose the upper surface of the columnar electrode 12 to the outside. Then, the solder ball 19 is formed on the upper surface of the columnar electrode 12, as shown in FIG. 7, followed by dicing the semiconductor substrate 11 so as to obtain individual semiconductor devices.

Figure 17:
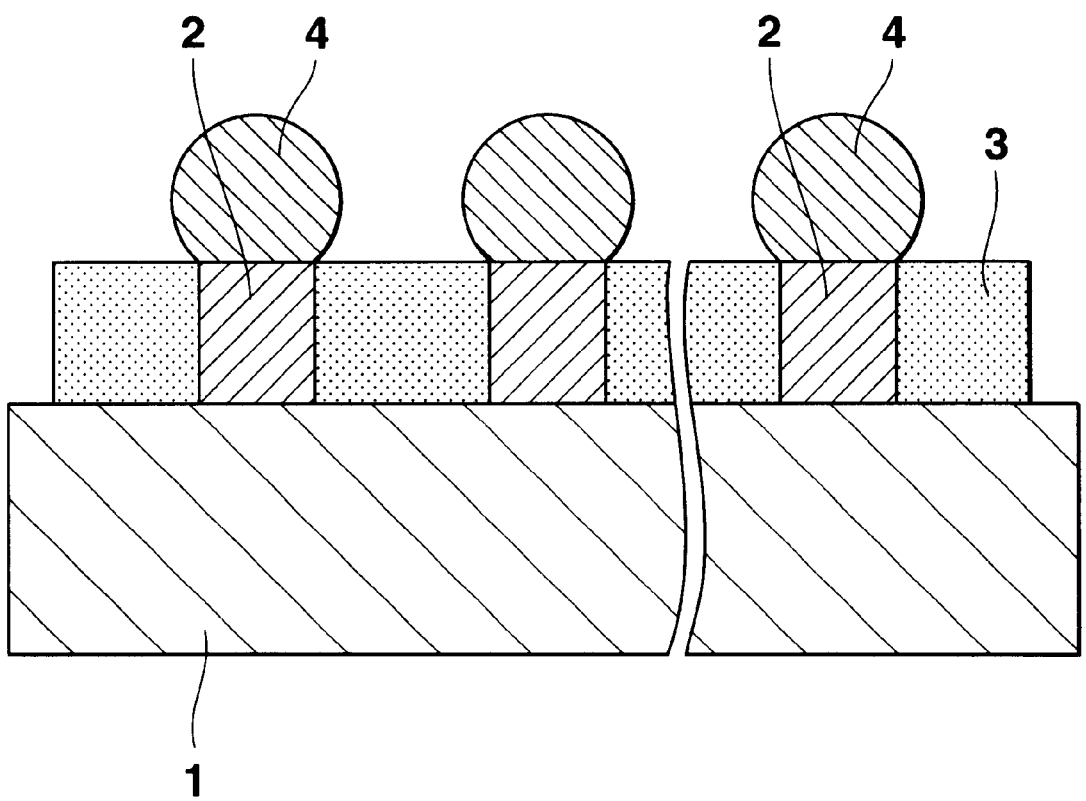

In the conventional semiconductor device, the thickness of the sealing film 3 loaded in the clearance between adjacent columnar electrodes 2 is equal to the height of the columnar electrode 2, as shown FIG. 17. As a result, the entire region of the columnar electrode 2 including both the upper and lower portions is strongly fixed, making it substantially impossible for the columnar electrode 2 to be swung along the surface of the semiconductor substrate 1. Where the semiconductor device is bonded to a terminal (not shown) of a circuit board by the solder ball 4 shown in FIG. 17, the difference in the linear expansion coefficient between the semiconductor substrate 1 of the semiconductor device and the circuit board brings about a serious problem. Specifically, if the ambient temperature is changed after the bonding, stress, which is derived from the difference in displacement between the solder ball 4 and the columnar electrode 2, is generated at the interface between the solder ball 4 that is displaced together with the circuit board and the columnar electrode 2 that is displaced together with the semiconductor substrate 1. However, the columnar electrode 2, which is strongly fixed over the entire region by the sealing film 3 as described previously, is incapable of being swung. It follows that the stress noted above cannot be absorbed by the interface between the columnar electrode 2 and the solder ball 4, leading to the crack occurrence at the interface between the two. On the other hand, when it comes to the semiconductor device shown in FIG. 7, the sealing film 18 is loaded in a recessed state to form a substantially U-shaped configuration such that the sealing film 18 is thinnest in the central portion between adjacent columnar electrodes 12. In other words, the sealing film 18 is not loaded in an upper portion of the space between adjacent columnar electrodes 12 and, thus, the upper portion of the columnar electrode 12 is not strongly fixed. Therefore, where the ambient temperature is changed so as to generate stress, which is derived from the difference in the linear expansion coefficient between the circuit board and the semiconductor substrate 11, at the interface between the solder ball 19 that is displaced together with the circuit board and the columnar electrode 12 that is displaced together with the semiconductor substrate 11, it is possible for the upper portion of the columnar electrode to be swung so as to moderate the stress. As a result, the stress derived from the difference in the thermal expansion coefficient between the semiconductor substrate 11 and the circuit board is absorbed by the columnar electrode 12. It follows that cracks are unlikely to be generated at the interface between the columnar electrode 12 and the solder ball 19.

Figure 10:
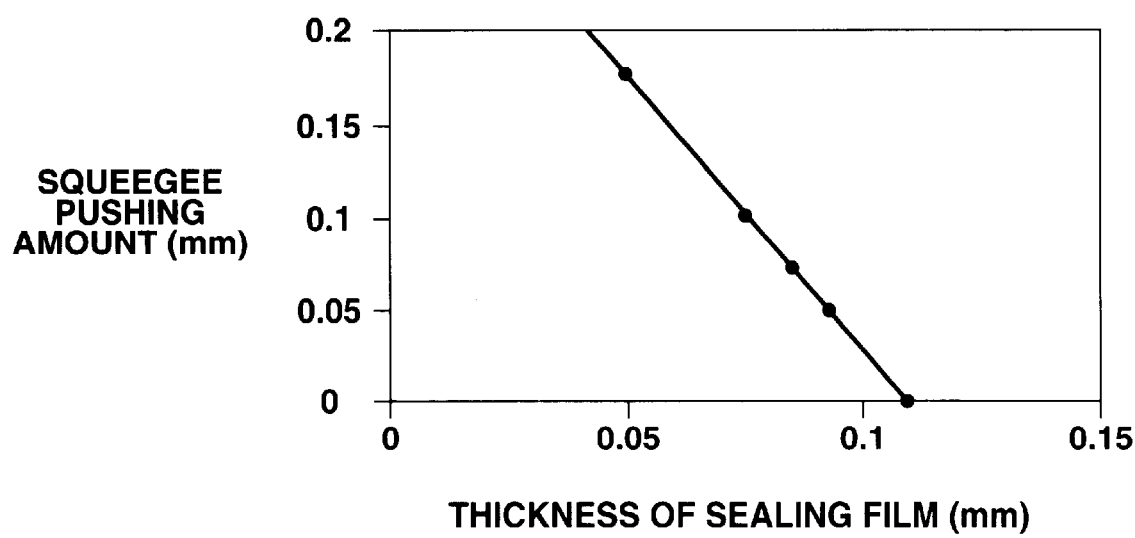
FIG. 10 is a graph showing the relationship between the pushing amount of a squeegee and the thickness of a sealing film.

The relationship between the pushing amount (mm) of the squeegee 17 and the thickness (mm) of the sealing film 18 was examined to obtain the result as shown in FIG. 10. In this case, the pushing amount of the squeegee 17 denotes the pushing amount of the tip portion of the squeegee 17 into the region between adjacent columnar electrodes with respect to the upper surface of the columnar electrode 12 having a height of about 110 μm, i.e., the distance between the upper surface of the columnar electrode and the tip of the squeegee. On the other hand, the thickness of the sealing film 18 denotes the thickness (minimum thickness) at the most recessed portion between adjacent columnar electrodes 12. As apparent from FIG. 10, the thickness of the sealing film 18 is inversely proportional to the pushing amount of the squeegee 17. It follows that the thickness of the sealing film 18 can be easily controlled by adjusting the pushing amount of the tip portion of the squeegee 17 into the region between adjacent columnar electrodes 12.

On the other hand, the present inventors looked into the relationship between the weight (g) of the liquid sealing resin printed on the semiconductor substrate 11 and the thickness (mm) of the sealing film 18. The relationship shown in FIG. 11 has been obtained in the case of the semiconductor substrate 11 of 125 mm (5 inches). Also, the relationship shown in FIG. 12 has been obtained in the case of the semiconductor substrate 11 of 150 mm (6 inches). In each of these cases, the weight of the liquid sealing resin printed on the semiconductor substrate 11 was obtained by subtracting the weight of the semiconductor substrate 11 measured in advance from the entire weight measured by a balance immediately after the screen printing. The weight of the liquid sealing resin before the curing was found to be substantially equal to that after the curing of the liquid sealing resin to substantially the original viscosity. Further, the thickness of the sealing film 18 denotes the thickness at the most recessed portion in the central portion between adjacent columnar electrodes 12. The thickness was measured with a micro meter after the liquid sealing resin was dried and cured.

Figure 11:
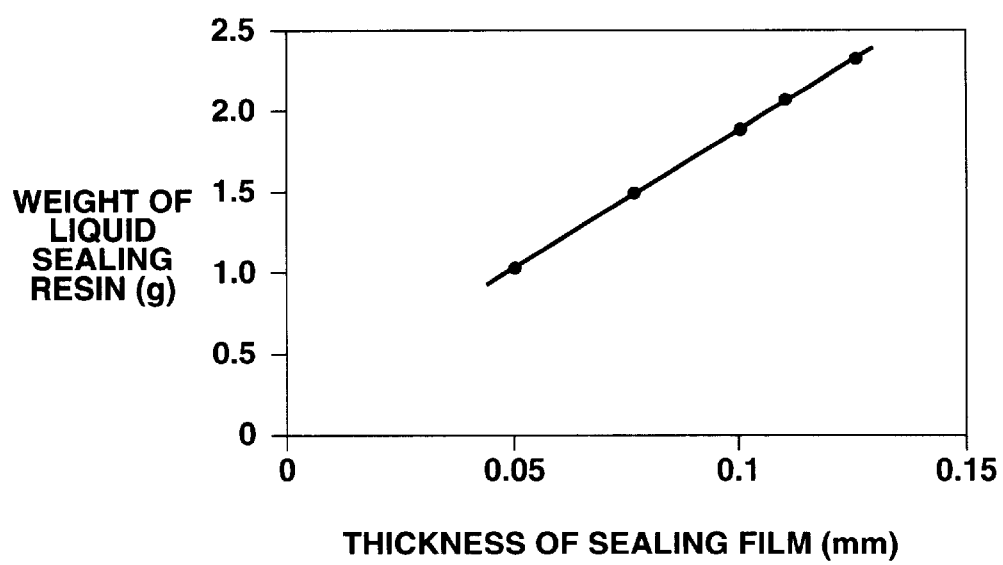
FIG. 11 is a graph showing as an example the relationship between the amount of a liquid sealing resin and the thickness of a sealing film.
Figure 12:
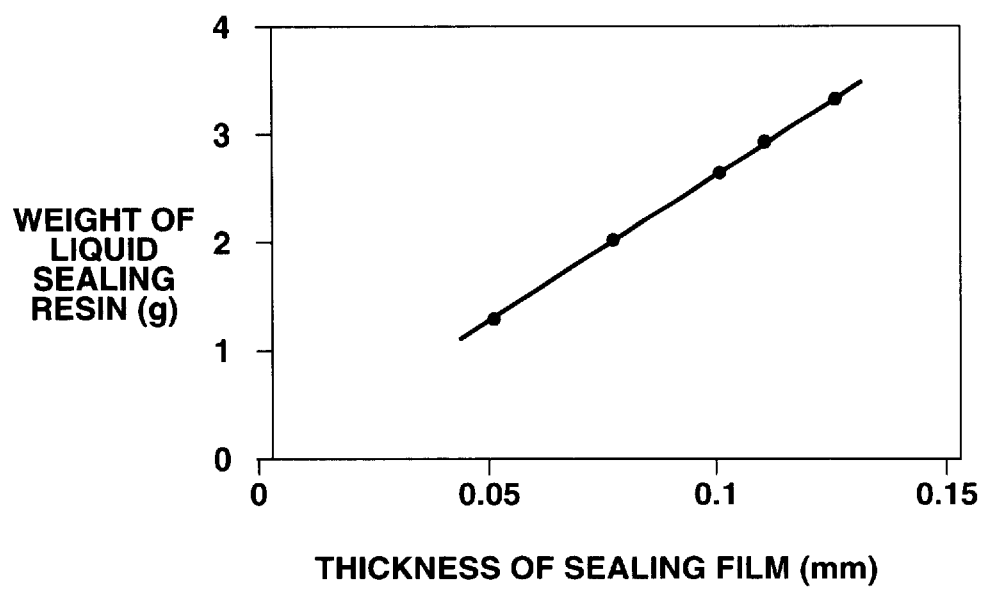
FIG. 12 is a graph showing as another example the relationship between the amount of liquid sealing resin and the thickness of a sealing film.

As apparent from FIGS. 11 and 12, the thickness of the sealing film 18 was found to be proportional to the weight of the liquid sealing resin printed on the semiconductor substrate 11. It follows that the thickness of the sealing film 18 can be controlled accurately by adjusting the weight of the liquid sealing resin printed on the semiconductor substrate 11.

As described above, it is possible to know the thickness of the sealing film 18 after cured by measuring the weight of the liquid sealing resin printed on the semiconductor substrate 11 immediately after the screen printing in the mass production of the semiconductor device. In other words, the thickness of the sealing film 8 can be measured indirectly. Also, where the measured value of the weight of the liquid sealing resin, i.e., the thickness of the sealing film 18 after cured, fails to meet a desired value, the weight of the liquid sealing resin printed on the semiconductor substrate 11 can be controlled by controlling the pushing amount of the squeegee 17, making it possible to control the thickness of the sealing resin 18 after cured. It follows that the thickness of the sealing resin 18 can be controlled in an early stage of the manufacturing process so as to prevent defective devices from being manufactured in a large amount.

[Third Embodiment]

Figure 13A:
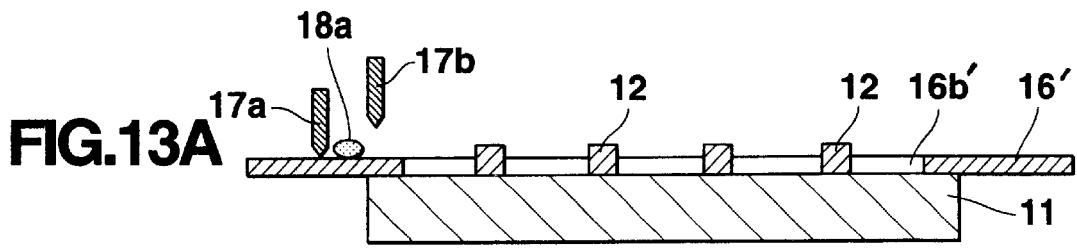
FIG. 13A is a partial cross sectional view showing the first step of a method of manufacturing a semiconductor device according to a third embodiment of the present invention.

Still another method of forming the sealing film 18 will now be described with reference to FIGS. 13A to 13E. In the first step, prepared is a screen printing machine provided with two squeegees 17a and 17b arranged a predetermined distance apart from each other, as shown in FIG. 13A. In this case, the squeegee 17a on the left side is for the forward movement, and the squeegee 17b on the right side is for the backward movement. These two squeegees 17a, 17b are positioned at the limit points on the left side. The squeegee 17a for the forward movement is moved downward so as to be brought into contact with the upper surface of the printing mask 16'. On the other hand, the squeegee 17b for the backward movement is positioned at the elevated point. In this case, the amount of the downward movement of the squeegee 17a for the forward movement corresponds to a predetermined pushing amount of the squeegee.

Figure 13B:
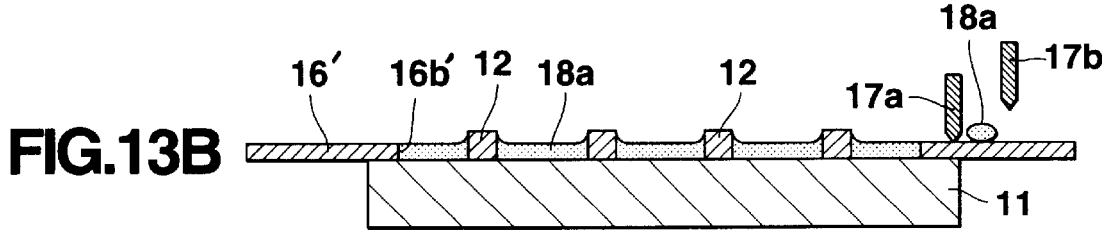
FIG. 13B is a partial cross sectional view showing the manufacturing step following the step shown in FIG. 13A.
Figure 13C:
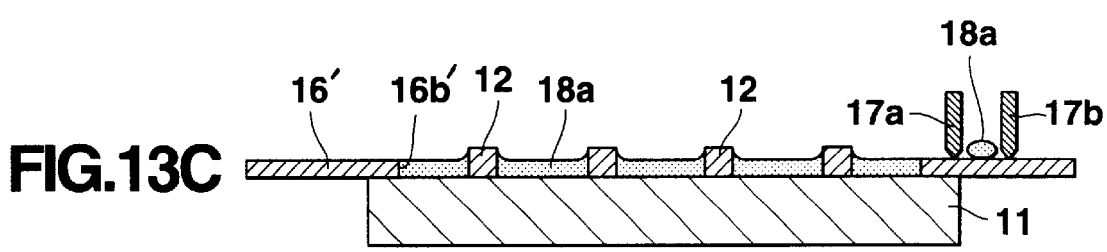
FIG. 13C is a partial cross sectional view showing the manufacturing step following the step shown in FIG. 13B.

A liquid sealing resin 18a is supplied onto the upper surface of the printing mask 16' in a position intermediate between the two squeegees 17a and 17b, and these two squeegees 17a, 17b are moved to the right. As a result, the liquid sealing resin 18a is printed within the opening 16b' of the printing mask 16' by the squeegee 17a for the forward movement, as shown in FIG. 13B. After these two squeegees 17a, 17b are moved to the limit points on the right side, the squeegee 17b for the backward movement is moved downward so as to be brought into contact with the upper surface of the printing mask 16', as shown in FIG. 13C. The amount of the downward movement of the squeegee 17b also corresponds to a predetermined pushing amount of the squeegee in this case, too.

Figure 13D:
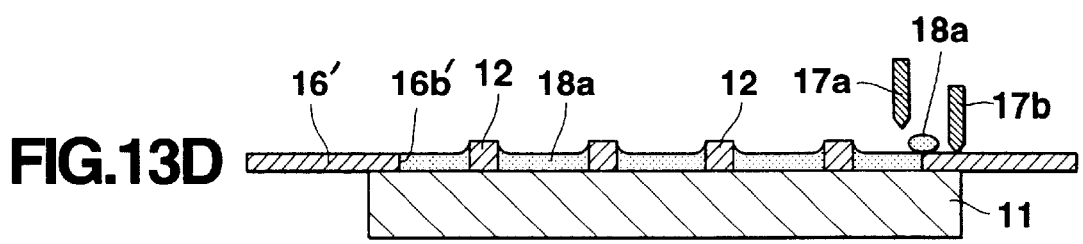
FIG. 13D is a partial cross sectional view showing the manufacturing step following the step shown in FIG. 13C.
Figure 13E:
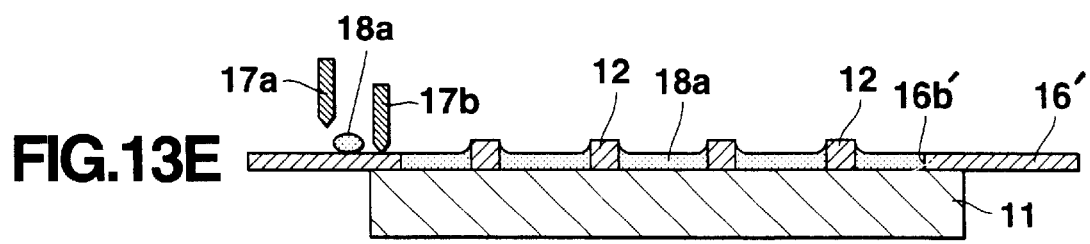
FIG. 13E is a partial cross sectional view showing the manufacturing step following the step shown in FIG. 13D.

Then, the two squeegees 17a, 17b are somewhat moved to the left. When the squeegee 17b for the backward movement is positioned on the semiconductor substrate 11, the squeegee 17b for the forward movement is moved upward, as shown in FIG. 13D. Then, the squeegees 17a, 17b are further moved to the left so as to permit the squeegee 17a for the backward movement to print the liquid sealing resin 18a within the opening 16b' of the printing mask 16', as shown in FIG. 13E, thereby finishing the printing process of the liquid sealing resin 18a.

As described above, the squeegee 17b for the backward movement is moved downward so as to be brought into contact with the upper surface of the printing mask 16', as shown in FIG. 13C. Then, the squeegee 17a for the forward movement is moved upward when the squeegee 17b for the backward movement is positioned on the semiconductor substrate 11, i.e., when the squeegee 17b for the backward movement has begun to move to the left in contact with the upper surface of the printing mask 16' so as to be positioned inside the edge of the semiconductor substrate 11. The reason for the particular operation is as follows;

Where the squeegee 17a for the forward movement is moved upward, followed by moving downward the squeegee 17b for the backward movement so as to be brought into contact with the upper surface of the printing mask 16' under the state shown in FIG. 13B, the printing mask 16' is caused to float up by the contact force of the squeegee 17b for the backward movement with the upper surface of the printing mask 16'. As a result, the liquid sealing resin 18a that has already been printed is moved into a region below the printing mask 16' so as to make the continuous printing impossible. The particular operation employed in the present invention is intended to avoid this difficulty.

Figure 14:
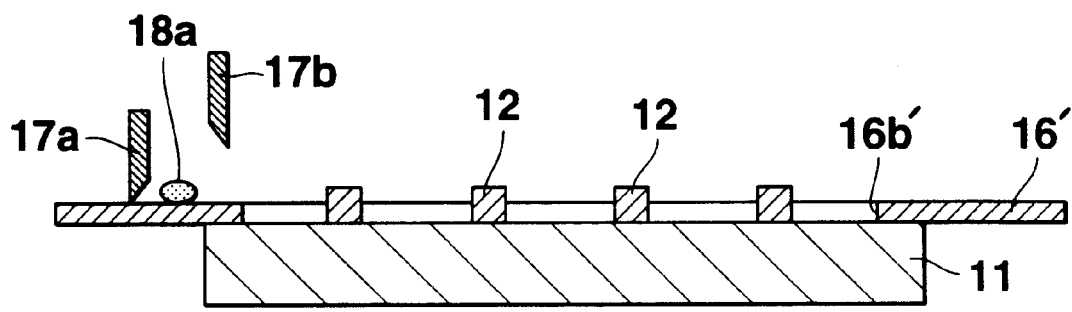
FIG. 14 is a cross sectional view showing a modification of a squeegee used in the present invention.
Figure 15:
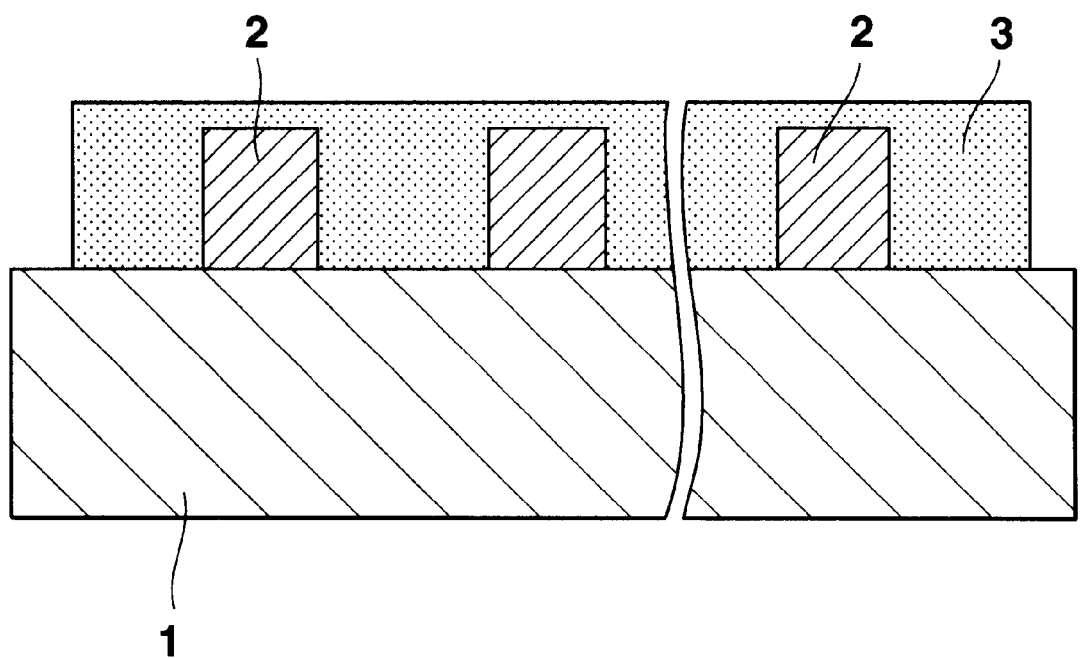
FIGS. 15 to 17 are partial cross sectional views showing the conventional method of manufacturing a semiconductor device.
Figure 16:
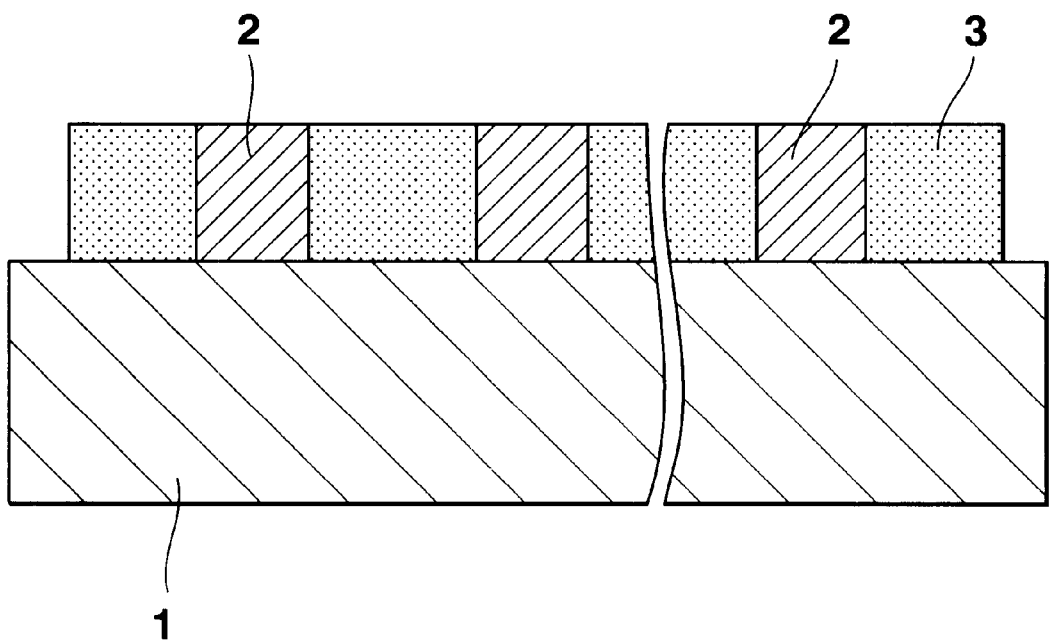

In the embodiment shown in FIGS. 13A to 13E, the tip portions of the squeegees 17a, 17b are substantially V-shaped in their side views. However, the shapes of these squeegees are not limited to those shown in the drawings. For example, it is also possible to use two squeegees having the tip portions shaped as shown in FIG. 14. As shown in the drawing, the right surface alone is inclined with the left surface held vertical in the tip portion of the squeegee 17a for the forward movement. On the other hand, the left surface alone is inclined with the right surface held vertical in the tip portion of the squeegee 17b for the backward movement. Also, in the embodiment shown in FIGS. 13A to 13E, the squeegees 17a, 17b are held perpendicular to the upper surface of the semiconductor substrate 11 for performing the forward printing and the backward printing. However, it is also possible to perform the forward printing and the backward printing by inclining the tip portions of the squeegees 17a and 17b relative to the line perpendicular to the upper surface of the semiconductor substrate 11. Also, in the embodiment described above, the semiconductor substrate 11 is constructed such that the conductive layer 103 is formed on the electrode pad 100, and the columnar electrode 12 is formed on the conductive film 103. However, it is also possible to use the semiconductor substrate 11 constructed such that the electrode pad alone is formed on the substrate, and the columnar electrode is formed in direct contact with the electrode pad. Also, it is desirable for the heating temperature of the heater 15 to be set at 30 to 50° C. However, it is possible for the heating temperature to be set up to at about 70° C. depending on the circuit board on which the semiconductor substrate is mounted. Further, in the embodiment described above, the sealing film is formed by the printing method using a printing mask. However, it is also possible to form the sealing film by directly dripping the liquid sealing resin onto the semiconductor substrate by using, for example, a dispenser. Further, it is possible to warm the liquid sealing resin to temperatures adapted for the coating or to temperatures lower than the temperatures adapted for the coating.

As described above, according to the present invention, it suffices to apply heating when the sealing film is formed by a screen printing method or a dispenser method, with the result that the sealing film can be formed easily by using a cheap apparatus. In addition, the viscosity of the liquid sealing resin can be lowered temporarily by the warming, making it possible to use a liquid sealing resin having a relatively high viscosity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

preparing a semiconductor substrate having a plurality of columnar electrodes formed apart from each other on one main surface;

loading a warmed liquid sealing resin between adjacent columnar electrodes on at least one main surface of the semiconductor substrate; and cooling the liquid sealing resin so as to solidify the sealing resin to form a sealing film on said one main surface of the semiconductor substrate.

2. The method of manufacturing a semiconductor device according to claim 1, wherein said liquid sealing resin is warmed by warming the semiconductor substrate.

3. The method of manufacturing a semiconductor device according to claim 2, wherein the liquid sealing resin supplied onto the semiconductor substrate is warmed to have a viscosity of 50,000 to 200,000 cPS.

4. The method of manufacturing a semiconductor device according to claim 2, wherein said sealing film is formed so as to be recessed to a position smaller than the height of each of the electrodes in a central region between adjacent columnar electrodes.

5. The method of manufacturing a semiconductor device according to claim 2, wherein said semiconductor substrate is heated to 30 to 70° C.

6. The method of manufacturing a semiconductor device according to claim 2, further comprising the step of removing the liquid sealing resin attached to the upper surface of the columnar electrode after formation of the sealing film.

7. The method of manufacturing a semiconductor device according to claim 6, further comprising the step of forming a solder layer on each of the columnar electrodes after the step of removing the liquid sealing resin.

8. The method of manufacturing a semiconductor device according to claim 7, further comprising the step of dicing the semiconductor substrate after the step of forming the solder layer on the columnar electrode.

9. The method of manufacturing a semiconductor device according to claim 2, further comprising the step of dicing the semiconductor substrate after the step of forming the sealing film.

10. A method of manufacturing a semiconductor device, comprising the steps of:

preparing a semiconductor substrate having a plurality of columnar electrodes formed apart from each other on one main surface;

arranging a printing mask on said semiconductor substrate;

heating the semiconductor substrate and said printing mask to a predetermined temperature;

supplying a liquid sealing resin onto the printing mask so as to have the liquid sealing resin warmed by the printing mask; and loading the warmed liquid sealing resin into the clearance between adjacent columnar electrodes formed on one main surface of the semiconductor substrate so as to form a sealing film.

11. The method of manufacturing a semiconductor device according to claim 10, wherein said liquid sealing resin before warming and supplied onto said printing mask has a viscosity of 500,000 to 1,500,000 cPS.

12. The method of manufacturing a semiconductor device according to claim 10, wherein said liquid sealing resin warmed by the printing mask has a viscosity of 50,000 to 200,000 cPS.

13. The method of manufacturing a semiconductor device according to claim 10, wherein said sealing film is formed so as to be recessed to a position smaller than the height of each of the columnar electrodes in a central region between adjacent columnar electrodes.

14. The method of manufacturing a semiconductor device according to claim 10, wherein said semiconductor substrate is heated to 30 to 70° C.

15. The method of manufacturing a semiconductor device according to claim 10, further comprising the step of removing the liquid sealing resin attached to the upper surface of each of the columnar electrodes after formation of the sealing film.

16. The method of manufacturing a semiconductor device according to claim 10, further comprising the step of forming a solder layer on each of the columnar electrodes after the step of removing the liquid sealing resin.

17. The method of manufacturing a semiconductor device according to claim 16, further comprising the step of dicing the semiconductor substrate after the step of forming the solder layer on each of the columnar electrodes.

18. The method of manufacturing a semiconductor device according to claim 10, further comprising the step of dicing the semiconductor substrate after the step of forming the sealing film.

19. The method of manufacturing a semiconductor device according to claim 10, wherein said printing is performed by moving squeegees each having a sharpened tip portion on said printing mask with the tip portion of the squeegee kept pushed into the region between adjacent columnar electrodes.

20. The method of manufacturing a semiconductor device according to claim 19, wherein said squeegee is moved with the central line in the tip portion of the squeegee held substantially perpendicular to said printing mask.

21. The method of manufacturing a semiconductor device according to claim 19, wherein the tip portion of said squeegee has a V-shaped configuration that is substantially symmetrical with respect to the central line of said tip portion.

22. The method of manufacturing a semiconductor device according to claim 19, wherein at least the tip portion of said squeegee is made of an urethane-based rubber.

23. The method of manufacturing a semiconductor device according to claim 19, wherein said squeegees perform a reciprocating movement on said printing mask.

24. The method of manufacturing a semiconductor device according to claim 23, wherein said squeegees are arranged both before and after the liquid sealing resin supplied onto said printing mask and both of said squeegees are moved in parallel.

25. The method of manufacturing a semiconductor device according to claim 24, wherein both of said squeegees are moved with the preceding squeegee in the moving direction being elevated to a position apart from said printing mask.

26. The method of manufacturing a semiconductor device according to claim 25, wherein said printing mask is sized larger than said semiconductor substrate and supported by the semiconductor substrate with the outer peripheral portion of the printing mask being held floating.

27. The method of manufacturing a semiconductor device according to claim 26, wherein said squeegees stop their movement at the point where the trailing squeegee is positioned on that region of said printing mask which is positioned outside the periphery of said semiconductor substrate.

28. The method of manufacturing a semiconductor device according to claim 27, wherein the trailing squeegee is in contact with said printing mask until the preceding squeegee is moved downward so as to be brought into contact with said printing mask.

29. The method of manufacturing a semiconductor device according to claim 10, wherein, after formation of the sealing film, the weight of the semiconductor substrate having the sealing film formed thereon is measured so as to judge based on the measured weight whether or not the thickness of the sealing film is appropriate.

30. A method of manufacturing a semiconductor device, comprising the steps of:

preparing a semiconductor substrate having a plurality of columnar electrodes formed apart from each other on one main surface;

arranging a mask on one main surface of the semiconductor substrate;

printing a liquid sealing resin on said one main surface of the semiconductor substrate from above the mask by using a squeegee so as to form a sealing film loaded in the clearance between adjacent columnar electrodes; and measuring the weight of the semiconductor substrate having the sealing film formed thereon so as to judge whether or not the thickness of the sealing film is appropriate.

31. The method of manufacturing a semiconductor device according to claim 30, wherein said sealing film is recessed in a region between adjacent columnar electrodes.

* * * * *